United States Patent [19]
Kawai

[11] Patent Number: 5,138,409
[45] Date of Patent: Aug. 11, 1992

[54] HIGH VOLTAGE SEMICONDUCTOR DEVICE HAVING SILICON-ON-INSULATOR STRUCTURE WITH REDUCED ON-RESISTANCE

[75] Inventor: Shinichi Kawai, Tokyo, Japan

[73] Assignee: Fujitsu Limited, Kawasaki, Japan

[21] Appl. No.: 714,985

[22] Filed: Jun. 14, 1991

Related U.S. Application Data

[63] Continuation of Ser. No. 476,911, Feb. 8, 1990, abandoned.

[30] Foreign Application Priority Data

Feb. 9, 1989 [JP] Japan .................. 1-30860

[51] Int. Cl.[5] ............................... H01L 29/10
[52] U.S. Cl. .................. 357/23.4; 357/23.7; 357/23.8; 357/23.9; 357/55
[58] Field of Search .......... 357/23.7, 23.8, 23.4

[56] References Cited

U.S. PATENT DOCUMENTS

| | | | |
|---|---|---|---|
| 4,236,167 | 11/1980 | Woods | 357/23.7 |
| 4,287,526 | 9/1981 | Sakuma | 357/23.7 |
| 4,394,674 | 7/1983 | Sakuna et al. | 357/23.8 |
| 4,748,485 | 5/1988 | Vasudev | 357/23.7 |
| 4,752,814 | 6/1988 | Tuán | 357/23.7 |
| 4,757,362 | 7/1988 | Biwa et al. | 357/23.8 |
| 4,882,295 | 11/1989 | Czubatyj et al. | 357/23.7 |
| 4,907,053 | 3/1990 | Ohmi | 357/23.7 |
| 4,952,825 | 8/1990 | Yoshida | 357/23.8 |

FOREIGN PATENT DOCUMENTS

| | | | |
|---|---|---|---|
| 56-088354 | 7/1981 | Japan | 357/23.7 |
| 57-190362 | 11/1982 | Japan | 357/23.7 |
| 60-54470 | 3/1985 | Japan | . |
| 61-232676 | 10/1986 | Japan | 357/23.7 |
| 62-005662 | 1/1987 | Japan | 357/23.7 |
| 5662 | 1/1987 | Japan | . |
| 63-119578 | 5/1988 | Japan | 357/23.7 |
| 238066 | 9/1989 | Japan | . |
| 2064866 | 11/1980 | United Kingdom | . |

OTHER PUBLICATIONS

IEEE International Solid-State Circuits Conference, vol. 19, No. 19, Feb. 18, 1976, pp. 58-59; Spliner et al., "High Voltage SOS/MOS Devices and Circuit Elements".

IEEE Transactions on Electron Devices, vol. ED-22, No. 9, Sep. 1975, pp. 733-739; Kramer, "Thin-film-transistor Switching Matrix for flat-panel Displays".

Patent Abstracts of Japan, vol. 9, No. 185 (E-332) [1908], Jul. 31, 1985.

International Electron Devices Meeting 1979, Washington, D.C., Dec. 3rd-5th 1979, pp. 549-597, Sakuma et al., "A High Voltage Offset-gate SOS/MOS Transistor".

Proceedings of the IEEE, vol. 55, No. 7, Jul. 1967, pp. 1217-1218; Wagner, "A Dual Offset Gate Thin-film Transistor".

*Primary Examiner*—Edward J. Wojciechowicz
*Attorney, Agent, or Firm*—Nikaido, Marmelstein, Murray & Oram

[57] ABSTRACT

A high-voltage metal-oxide-semiconductor transistor device having a semiconductor-on-insulator structure comprises a substrate, an insulator layer provided on the substrate, a semiconductor layer of a first conductive type provided on the insulator layer, a source region of a second conductive type defined in the semiconductor layer, a drain region of the second conductive type defined in the semiconductor layer, a gate insulator film provided on the semiconductor layer so as to cover a part of the surface of the semiconductor layer adjacent to the source region, a gate electrode provided on the gate insulator film, an offset region defined in the semiconductor layer between the part of the semiconductor layer covered by the gate insulator film and the drain electrode, a less-doped region defined within the offset region at an upper part thereof, a control electrode provided between the substrate and the insulator layer so as to extend along a boundary between the insulator layer and the substrate at least under the offset region, and a driving circuit for supplying a control voltage to the control electrode simultaneously and in response to the gate voltage with such a magnitude that an inversion layer is formed in the semiconductor layer along the control electrode when the control voltage is applied to the control electrode.

12 Claims, 5 Drawing Sheets

HIGH VOLTAGE SEMICONDUCTOR DEVICE HAVING SILICON-ON-INSULATOR STRUCTURE WITH REDUCED ON-RESISTANCE

This application is a continuation of application Ser. No. 476,911 filed Feb. 8, 1990 now abandoned.

BACKGROUND OF THE INVENTION

The present invention generally relates to semiconductor devices and more particularly to a high-voltage MOS device having a so-called semiconductor-on-insulator or SOI structure.

In the SOI structure, active devices are constructed on respective insulator layers which in turn are provided on a semiconductor substrate. By using this structure, complete device isolation is achieved. Thus, there are various attempts to construct high-voltage MOS-FETs, such as the one used in the display panel driving or in the electro-mechanical control where a high withstand voltage is required, in a form of the SOI structure.

FIG. 1 shows a prior art MOSFET device having such an SOI structure. The MOSFET shown in the drawing has a so-called offset gate structure wherein the source and drain regions of the device are provided asymmetrically with respect to the gate, and the gate is provided close to the source region of the device.

Referring to FIG. 1, this prior art MOSFET device comprises a silicon substrate 11 of a first conductive type, an insulator layer 12 typically of sapphire and provided on the substrate 11, and a semiconductor layer 13 on the insulator layer 12. The semiconductor layer 13 is doped to the first conductive type and is covered by a gate insulator film 14 in correspondence to a part of the semiconductor layer 13 where a gate electrode 15 is provided, and the gate electrode 15 is provided on the gate insulator film 14 as usual. Further, a source region 17 and a drain region 18, both having a second conductive type, are defined in the semiconductor layer 13 with such a relation that the source region 17 is located adjacent to the gate electrode 15 while the drain region 18 is separated from the gate electrode 15 by an offset region 19. This offset region 19 includes a less-doped region 19a in the upper part thereof. This region 19a is doped to the second conductive type though with a reduced dopant level.

The active part of the MOSFET of FIG. 1 is thus formed on the semiconductor layer 13 which is isolated from other MOSFET devices on the same substrate. Thus, an ideal device isolation is achieved when the MOSFET is assembled in a form of integrated circuit.

Such a MOSFET having the offset gate structure provides a preferable feature in that the drain breakdown voltage is increased by reducing the thickness of the semiconductor layer 13. More specifically, when the thickness of the semiconductor layer 13 is reduced, the offset region 19 is depleted substantially entirely in response to the drain voltage because of the reverse biasing of a p-n junction formed in this offset region between the less-doped region 19a and the rest of the semiconductor layer 13 underneath. Note that the less-doped region 19a has the second conductive type while the semiconductor layer 13 in the region 19 has the first conductive type. Thus, when the drain voltage is applied between the source and drain regions, the depletion region spreads upwards and downwards in the vertical direction from the p-n junction in the offset region. With reduced thickness of the offset region 19, the depletion region formed therein easily extends throughout its entire thickness. In such a situation, increase of the drain voltage contributes only to the increase of lateral electric field across the offset region. Therefore, the expansion of the offset length makes the drain breakdown voltage higher.

In the MOSFET having the offset gate structure as such, however, there arises a problem in that the resistance between the source region 17 and the drain region 18 in the turn-on state of the device or so-called on-resistance is increased because of the existence of depletion region in the offset region 19. In order to reduce this on-resistance, it is necessary that the dose of the less-doped region 19 including the less-doped region 19a is increased. However, increase of the dose in the region 19 raises a problem in that the impurities tend to be diffused into the region underneath the less-doped region 19a upon heat treatment applied during the fabrication process. Thus, it is difficult to limit the less-doped region 19a in the upper part of the semiconductor layer 13 when the dose is increased.

Further, because of the tendency of non-uniform distribution of the electric field in the semiconductor layer 13, there appears a concentration of an electric field in the source side edge of the doped regions 19a and 18 shown in FIG. 1 by A and B. As the p-n junction is formed in the region A or B, the excessive increase of the electric field in such a region invites a breakdown of the junction when the dose is increased in the region 19. Thus, the drain breakdown voltage, which is substantially determined by the regions A and B, is deteriorated and the device becomes fragile to the surge of the drain voltage.

From the foregoing reasons, the approach to increase the dose of the impurities is inappropriate, and the problem of achieving a high drain breakdown voltage and at the same time a reduced on-resistance remains unsolved.

SUMMARY OF THE INVENTION

Accordingly, it is a general object of the present invention to provide a novel and useful MOSFET device having the SOI structure, wherein the aforementioned problems are eliminated.

Another object of the present invention is to provide a MOSFET device having the SOI structure wherein a high drain breakdown voltage and a reduced on-resistance are simultaneously achieved.

Another object of the present invention is to provide a MOSFET device having a so-called SOI structure in which the device is constructed on an insulator layer which in turn is provided on a semiconductor substrate, wherein the gate electrode is provided on a semiconductor layer provided on the insulator layer, further in the semiconductor layer the source region and the drain region are defined, with such a relation that the gate electrode is located adjacent to the source region with an intervening region formed in the semiconductor layer between the gate electrode and the drain region, the intervening region comprising a less-doped region of the second conductive type but with a smaller dose of dopants in the upper part of the intervening region, wherein there is provided a control electrode in the semiconductor substrate at least in correspondence to the intervening region such that the control electrode is separated from the semiconductor layer by the insulator layer forming the SOI structure. According to the present invention, the drain breakdown voltage in the turn-off state of the device is increased because of the depletion region formed at the p-n junction in the offset region, while the on-resistance is decreased by applying a control voltage to the control electrode simultaneously to the gate voltage such that there is formed an inversion layer in the offset region along the boundary to the underlying insulator layer.

Other objects and further features of the present invention will become apparent from the following detailed description when read in conjunction with attached drawings.

DETAILED DESCRIPTION

Figure 2:
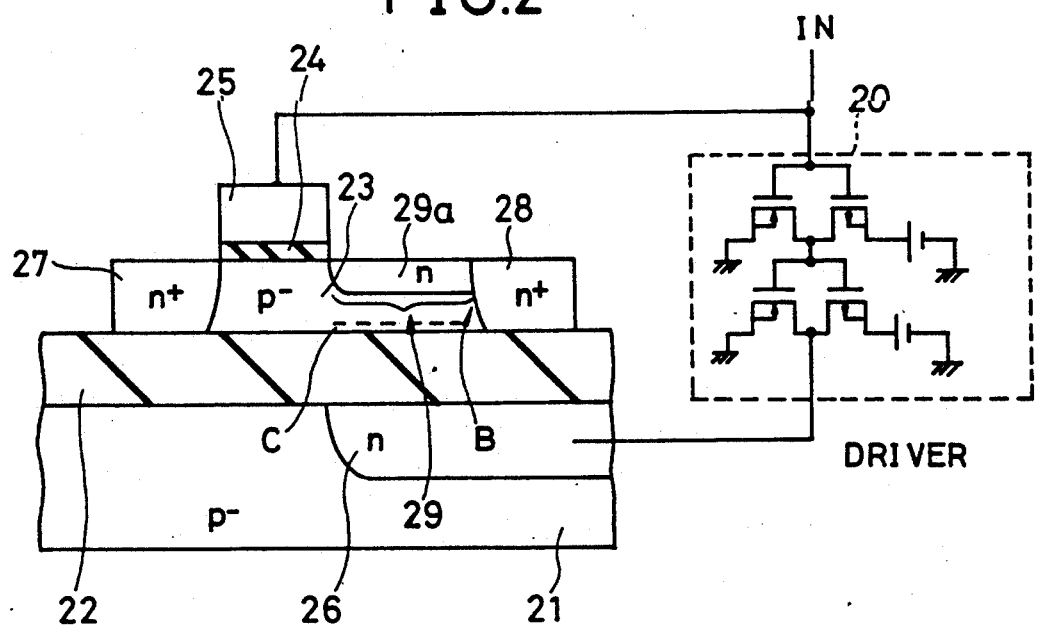
FIG. 2 is a diagram showing the essential part of the MOSFET according to a first embodiment of the present invention.

First, principle of the present invention will be described with reference to FIG. 2 showing an essential part of the MOSFET according to a first embodiment of the present invention.

Referring to FIG. 2, the MOSFET has a typical SOI structure and comprises a silicon substrate 21, an insulator layer 22 provided on the silicon substrate 21, and a silicon layer 23 forming a mesa structure on the insulator layer 22. On the semiconductor layer 23, there is provided a gate insulator film 24 on which a gate electrode 25 is provided, while in the silicon layer 23, there are defined a source region 27 and a drain region 28 as usual. As illustrated in FIG. 2, the gate electrode 25 is provided adjacent to the source region 27 and the device takes the offset-gate structure, wherein an offset region 29 is formed between the gate electrode 25 and the drain region 28.

Figure 1:
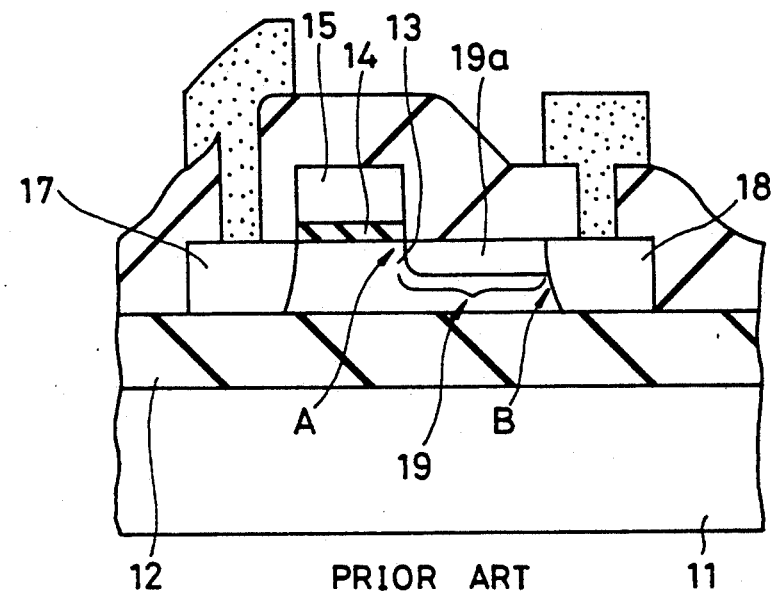
FIG. 1 is a diagram showing the structure of a prior art offset-gate type MOSFET.

In this MOSFET, the silicon substrate 21 and the silicon layer 23 are doped to the P$^-$-type with the impurity level of about $1 \times 10^{16}$/cm$^3$ while the source and drain regions 27 and 28 are doped to the n$^+$-type with the dose of about $2-4 \times 10^{15}$/cm$^3$. Further, a less-doped region 29a of the n-type is defined in the upper part of the region 29 with a reduced dose of $1-3 \times 10^{12}$/cm$^3$. In such a structure, it is noted that there is formed a p-n junction between the region 29a and the rest of the region 29 underneath the region 29a similarly to the prior art MOSFET of FIG. 1.

In the turn-off state of the device, the p-n junction is biased in the reverse direction responsive to the positive voltage at the drain region 28 and thus a depletion region is formed in the offset region 29. This depletion region reduces the strength of electric field applied to the channel region by the drain electrode and thereby the source-drain breakdown characteristic of the device is significantly improved. As the dose of the region 29a forming the p-n junction is reduced to the level already described, it becomes possible to set the depth or vertical level of the p-n junction substantially at the center of the offset region 29. Thus, the depletion region extends upwards and downwards from the p-n junction substantially entirely through the offset region 29 and an effective increase of the drain breakdown voltage is achieved. Further, such a depletion region in the offset region 29 increases the breakdown voltage between the gate and the drain.

In the MOSFET of FIG. 2, another electrode or a control electrode 26 is provided in the substrate 21 under the insulator layer 22 in correspondence to the offset region 29 in the silicon layer 23, and a driver circuit 20 is provided so as to apply a control voltage to the control electrode 26 simultaneously and in response to the gate voltage which is applied to the gate electrode 25. The thickness of the insulator layer 22 is set such that the electric field induced in the silicon layer 23 by the control electrode 26 does not cause breakdown at the edge region B where the p-n junction is formed and a concentration of the electric field tends to occur. Further, the thickness of the insulator layer 22 is determined such that there appears an inversion layer C in the silicon layer 23 along the insulator layer 22 in response to the control voltage applied to the control electrode 26. In the foregoing dose of the substrate 21 and the silicon layer 23, a layer thickness of about 1.0–1.5 μm, 2.0 μm in the maximum, is preferred for the insulator layer 22. When the layer thickness and dose are set as such, the inversion layer C can be formed by the control voltage with a magnitude of about 30 volts or less.

When the inversion layer is formed, the conductance between the source and drain is significantly increased. As the control voltage is applied in coincidence to the gate voltage, the increase of conductance provides decrease of on-resistance of the device. Further, the control electrode 26 compensates the increase of resistance of the less-doped region 29a which is caused by injection of hot carrier to interlayer insulation layer (not shown in FIG. 2), by inducing the inversion layer.

The driver circuit 20 illustrated in FIG. 2 is a boost circuit and applies the control voltage of which magnitude is chosen such that the inversion layer is formed in the silicon layer 23 yet no breakdown occurs at the region B, on the control electrode 26 in correspondence to the gate voltage. Note that the driver circuit 20 is not limited to such a boost circuit but any other circuit may be employed as long as the foregoing inversion layer is induced in the silicon layer 23 in response to the control voltage without causing the breakdown at the region B.

Figure 3:
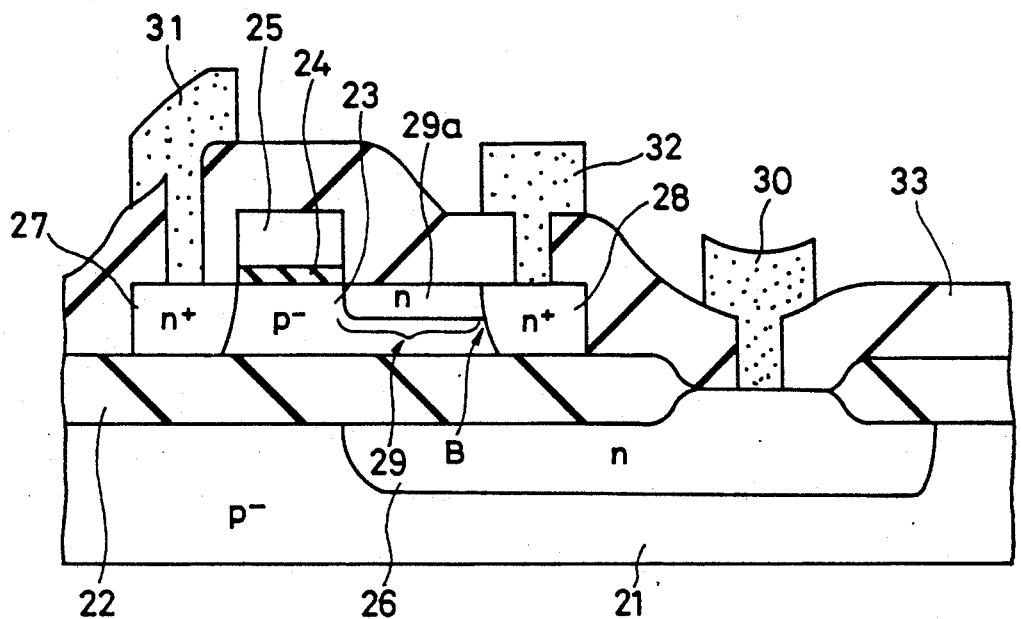
FIG. 3 is a diagram showing the MOSFET of FIG. 2 in a complete form.

Next, the structure of the MOSFET of FIG. 2 will be described with reference to FIG. 3. Referring to FIG. 3, the control electrode 26 comprises an n-type well formed in the substrate 21 which is doped to the p$^-$-type as already described. Further, the entire structure is covered by an interlayer insulation layer 33 in which contact holes are provided in correspondence to a source electrode 31 contacting with the source region 27 and a drain electrode 32 contacting with the drain region 28. Contact hole for the gate electrode 25 is not shown in this drawing as this contact hole is not in the plane of this cross-sectional view. Further, the insulator layer 22 is provided with an aperture exposing a part of the control electrode 26 outside of the mesa of the silicon layer 23, and a contact hole is provided on the interlayer insulator 33 covering the aperture in correspondence to where the control electrode 26 is exposed, wherein an electrode 30 is provided so as to achieve the electrical connection between the driver circuit 20 and the control electrode 26.

In the fabrication of the device of FIG. 3, the control electrode 26 is formed first by selective ion implantation of phosphorus into the silicon substrate 21 with a dose of $1 \times 10^{13}/cm^2$ followed by annealing. This silicon substrate 21 has the impurity level of about $1 \times 10^{16}/cm^3$ as already described and may have a resistivity of about 1 Ωcm. The insulator layer 22 acts as the field oxide layer and may be formed by selective thermal oxidation of the silicon substrate 21 for a thickness of about 1 μm-2.0 μm, preferably less than about 1.5 μm while protecting the aperture region to be used for interconnection to the electrode 30 by a suitable means such as mask of silicon oxide or silicon nitride.

Next, the mask is removed and after a modest thermal oxidation, a layer of polysilicon is deposited on the insulator layer 22 covering the substrate 21 by chemical vapor deposition. This polysilicon layer is annealed thereafter by irradiation of energy beam such as laser beam and a single crystal silicon layer covering the surface of the insulator layer 22 is obtained.

This single crystal silicon layer is further patterned such that the mesa structure is formed in correspondence to each of the MOSFET devices, and thus the silicon layer 23 shown in FIG. 3 is obtained. This silicon layer 23 is then subjected to ion implantation of boron with a dose of $1 \times 10^{12}/cm^2$. With this, the layer 23 is doped to the $p^-$-type.

Further, the gate insulator film 24 is formed on the surface of the silicon layer 23 by thermal oxidation for a thickness of about 1000-2000 Å, and the gate electrode 25 is formed on the gate insulator film 24 by depositing polysilicon for a thickness of about 0.5 μm.

Next, implantation of phosphorus is made into the region corresponding to the offset region 29 with a dose of about $2 \times 10^{12}/cm^2$ to form the less-doped region 29a, and the source region 27 and the drain region 28 are formed by again applying the ion implantation of phosphorus with a dose of about $2 \times 10^{15}/cm^2$.

Further, the entire structure is covered by the interlayer insulator 13 of PSG (phosphosilicate glass) or silicon oxide deposited by CVD, and after provision of the contact holes and the aluminium electrodes 30, 31 and 32, the device having the structure shown in FIG. 3 is completed.

By forming the field oxide layer 22 for the thickness as described together with the dose in the offset region 29 described already, it becomes possible to form the inversion layer in the offset region 29 by the control voltage of about 20 volts.

Although the description heretofore is made for the n-channel type MOSFET, the construction to provide the control electrode under the field oxide layer and apply a control voltage to the control electrode simultaneously to the gate voltage to the gate electrode is effective also in the case of the p-channel type MOSFET.

Figure 4A:
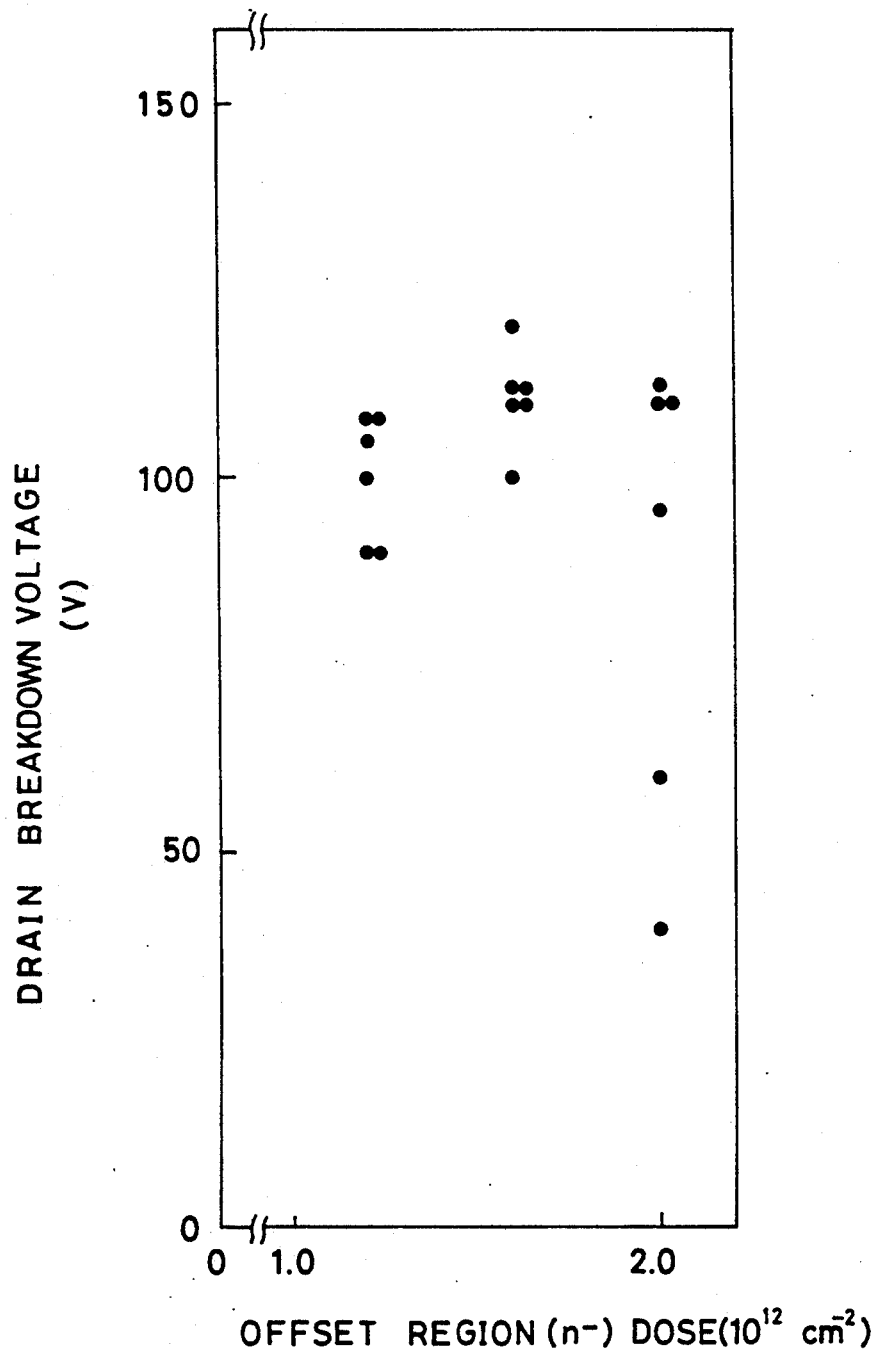
FIGS. 4A and 4B are graphs showing the drain breakdown voltage and the improvement of the on-resistance achieved by the device of FIG. 2.
Figure 4B:
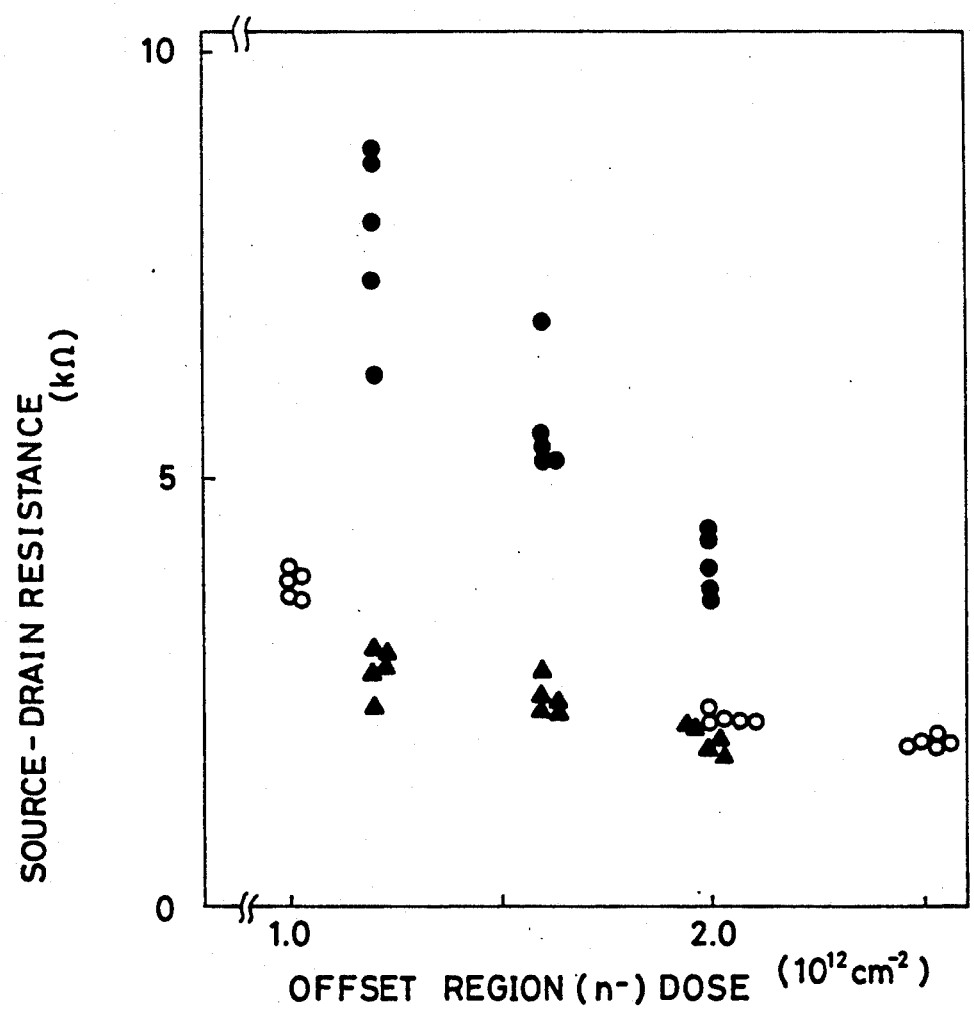

FIGS. 4A and 4B show the result of improvement achieved for the drain breakdown voltage and on-resistance by the MOSFET of FIG. 2. The test was conducted on sample devices of n-channel type and p-channel type having a length of 20 μm for the offset region 29, a gate length of 10 μm, and a gate width of 10 μm, although only the results for the n-channel type devices are presented. As shown in FIG. 4A, a drain breakdown voltage of about 100 volts or more was achieved by the present construction. Further, as shown in FIG. 4B, the source-drain resistance in the turn-on state of the n-channel type device, shown in the drawing by solid triangles, is reduced to about one-half as compared to the conventional SOI MOSFET shown in the drawing by solid circles. The open circles in FIG. 4B represents the result for the offset-gate type MOSFET not having the SOI structure. This result shows that the SOI type MOSFET of the present invention can achieve an on-resistance superior to that of the device not having the SOI structure in case the $n^-$ dose of the offset region reduced less than $2 \times 10^{12}/cm^2$. The decrease of source-drain current to about one-half means the increase of source-drain current of about 100%. In the case of p-channel type MOSFET, an increase of source-drain voltage of about 30% was achieved.

Next, a second embodiment of the MOSFET according to the present invention will be described with reference to FIG. 5. In the drawing, the parts constructed identically to the parts already described with reference to preceding drawings are given identical reference numerals and the description thereof will be omitted.

In this embodiment, the control electrode 26 is not limited to the region under the offset region 29 but provided so as to extend throughout the mesa structure of the MOSFET device. In other words, the control electrode 26 is provided in the substrate 21 in correspondence to the entire silicon layer 23 and associated therewith, an advantage is obtained such that difficulty associated with the exact alignment between the offset region 29 and the control electrode 26 is eliminated in this embodiment. Further, the on-resistance is reduced because of the extension of the inversion layer, shown as C' in this drawing, throughout the region between the source region 27 and the drain region 28. In FIG. 5, note that the device is a p-channel type MOSFET and the driver circuit 20 is not shown, although the driver circuit is used when the inversion layer C' is formed in the silicon layer 23.

Figure 6:
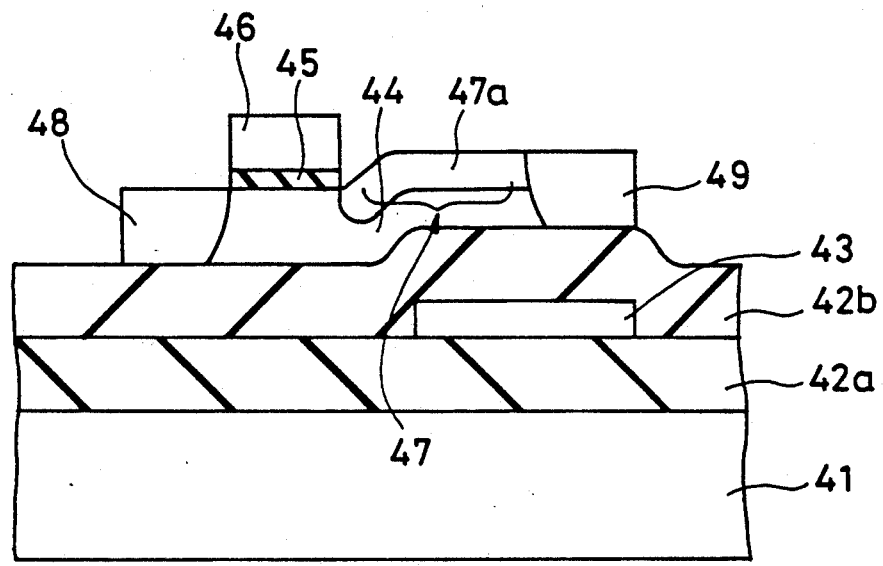
FIG. 6 is a diagram showing a third embodiment of the MOSFET of the present invention.

FIG. 6 shows a third embodiment of the MOSFET according to the present invention. In this embodiment, an insulator layer 42a is provided so as to cover the surface of a silicon substrate 41 which may have the dose similar to the substrate 21 of the foregoing embodiments. The insulator layer 42a may be a silicon layer formed by thermal oxidation of the silicon substrate 21. On this insulator layer 42a, a control electrode 43 corresponding to the control electrode 26 of the foregoing embodiments is provided and after a suitable patterning, the control electrode 43 is buried under another insulator layer 42b which may be a silicon oxide layer deposited by chemical vapor deposition.

On the insulator layer 42b, a polysilicon layer 44 is deposited and annealed so that the layer 44 is recrystalized into a single crystal phase. The silicon layer 44 is doped either to the p-type or to the n-type with a dose level similar to that of the silicon layer 23 in the preceding embodiments. After deposition of a gate insulator layer 45 and the gate electrode 46 as usual, the silicon layer 44 is doped such that a less-doped region 47a is formed in correspondence to the offset region shown as a region 47, and source and drain regions 48 and 49 are formed by ion implantation. This embodiment is advantageous from the view point of increasing the integration density of the device in the integrated circuit, as the control electrode 43 is formed with a reduced size by patterning.

Figure 7:
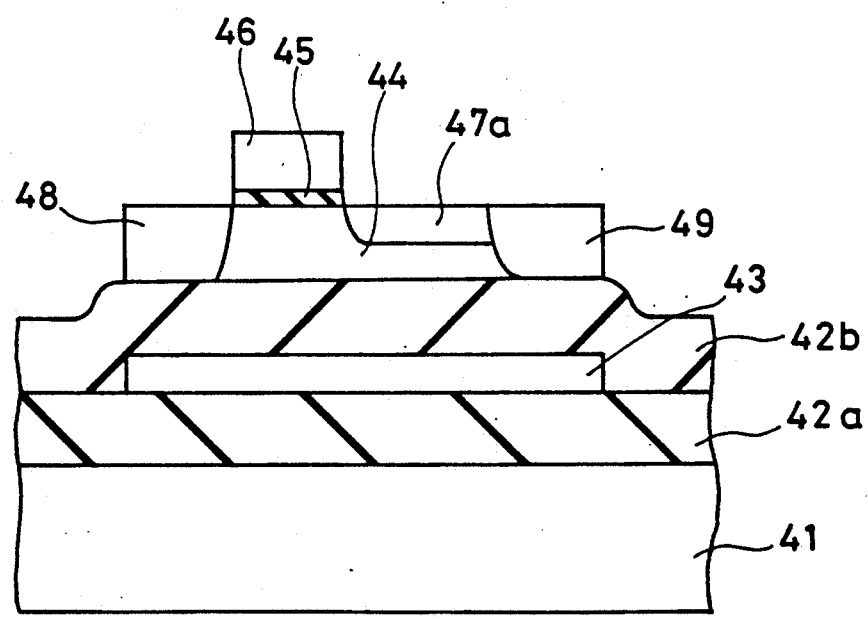
FIG. 7 is a diagram showing a fourth embodiment of the MOSFET of the present invention.

FIG. 7 shows another embodiment of the present invention which is actually a modification of the device of FIG. 6. In FIG. 7, the parts identically constructed to those in FIG. 6 are given identical reference numerals and the description thereof will be omitted.

In this embodiment, the only difference is that the control electrode 42a extends throughout the region under the semiconductor layer 44. According to the present invention, an advantage similar to the one shown in FIG. 5 is obtained because of the extension of the inversion layer throughout the semiconductor layer 44 between the source region 48 and the drain region 49. Further, by adopting the structure in which the control electrode is provided on the insulator layer 42a by patterning, the step of implanting ions into the substrate and subsequent heat treatment to form the buried control electrode 26 in the substrate is eliminated.

Figure 5:
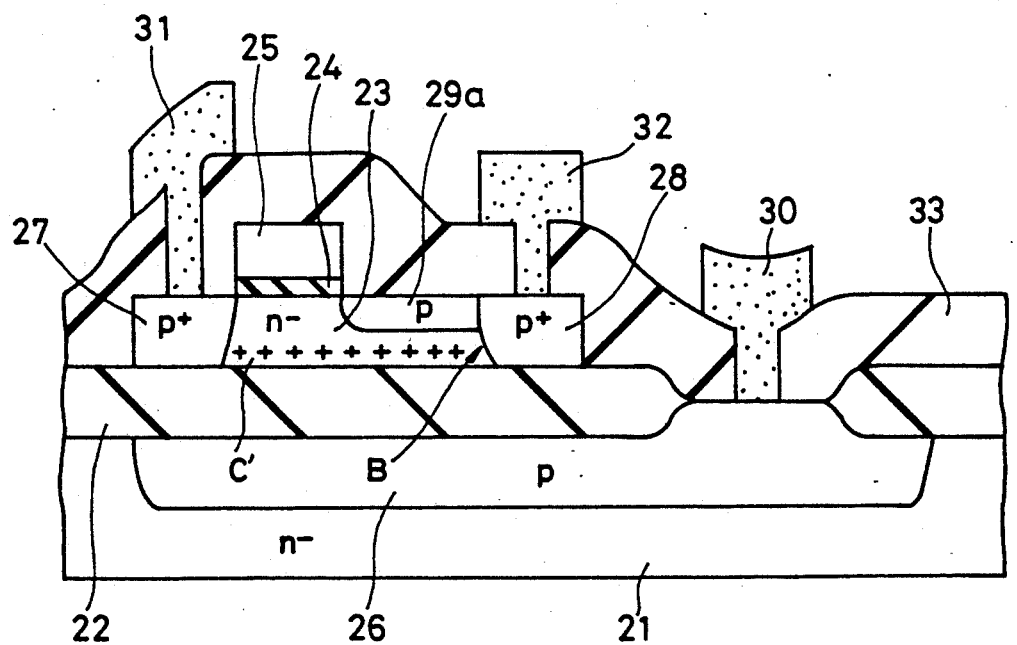
FIG. 5 is a diagram showing a second embodiment of the MOSFET of the present invention.

In any of the embodiments of FIGS. 5-7, the driver circuit 20 is not illustrated as the circuit operates identically to the case of the first embodiment. Thus, the control electrode 26 of FIG. 5 or the control electrode 43 of FIG. 6 and FIG. 7 are applied with the control voltage simultaneously and in synchronization to the gate voltage with such a magnitude to induce the inversion layer in the semiconductor layer 23 or 44 either throughout or in correspondence to the offset region. Note that this driver circuit 20 may be provided as a part of the integrated circuit on the same substrate. As already noted, the driver circuit 20 is not limited to the boost circuit but any other appropriate circuit which produces the output control voltage having the magnitude sufficient to induce the inversion layer in the silicon layer may be used.

Further, the present invention is not limited to these embodiments described heretofore, but various variations and modifications may be made without departing from the scope of the present invention.

What is claimed is:

1. A high-voltage metal-oxide-semiconductor transistor device having a semiconductor-on-insulator structure, comprising:
   a substrate having upper and lower major surfaces;
   a first insulator layer having upper and lower major surfaces and provided on the upper major surface of said substrate;
   a semiconductor layer of a first conductivity type having upper and lower major surfaces and provided on the upper major surface of said first insulator layer, the upper major surface of said semiconductor layer being defined with a first top surface area and a second top surface area located adjacent each other, said semiconductor layer having a first top surface region formed under the first top surface area and a second top surface region formed under the second top surface area adjacent to the first top surface region, and provided on said first insulator layer;
   a source region of a second conductivity type defined in said semiconductor layer adjacent to the first top surface region at a side opposite the second top surface region;
   a drain region of the second conductivity type having a predetermined doped level defined in said semiconductor layer adjacent to the second top surface region at a side opposite the first top surface region;
   a gate insulator film provided on said semiconductor layer so as to cover the first top surface area;
   a gate electrode provided on said gate insulator film;
   an offset region defined in said semiconductor layer corresponding to the second top surface region such that said offset region extends between said drain region and the first top surface region, said offset region having upper and lower offset regions, said upper offset region having an upper surface coincident to the upper major surface of said semiconductor layer and a lower surface, said lower offset region having an upper surface and a lower surface that coincides with the lower major surface of said semiconductor layer, the upper offset region being formed on the upper surface of the lower offset region such that the lower surface of the upper offset region forms a boundary with the lower offset region,
   the upper offset region being doped to the second conductivity type to a reduced doping level less than the predetermined doped level of the drain region and forming a p-n junction at a lower surface forming the boundary to the lower offset region;
   a control electrode provided below the upper major surface of the first insulator layer to extend along said semiconductor layer at least under the second top surface area of the semiconductor layer; and
   driving means connected to said gate electrode and to said control electrode for supplying a gate voltage and a control voltage, respectively thereto, said driving means producing the control voltage simultaneously with and in response to the gate voltage such that an inversion layer is formed in said semiconductor layer along the lower surface thereof at least under the second top surfaces area when the control voltage is applied to the control electrode.

2. A device as claimed in claim 1 wherein the control voltage is greater than or equal to said gate voltage.

3. A device as claimed in claim 1 in which said driving means includes a boost circuit for producing the control voltage with a magnitude is greater than or equal to said gate voltage.

4. A device as claimed in claim 1 in which said insulator layer has a predetermined thickness for causing inversion in said semiconductor layer along the boundary between the semiconductor and said insulator layer when the control voltage is applied to the control electrode.

5. A device as claimed in claim 4 in which the upper offset region is doped with a doping level in the range of $1-3\times 10^{12}/cm^2$.

6. A device as claimed in claim 1 in which said insulator layer has a thickness of 2 μm or less.

7. A device as claimed in claim 6 in which said insulator layer has a thickness in the range of 1 μm-1.5 μm.

8. A device as claimed in claim 1 in which said control electrode extends under said offset region for a length corresponding to that of said offset region.

9. A device as claimed in claim 1 in which said control electrode extends under the offset region for an entire length of said semiconductor layer.

10. A device as claimed in claim 1 in which said control electrode is formed in said substrate in a form of a buried layer.

11. A device as claimed in claim 1 further comprising a second insulator layer provided on said first insulator layer such that said semiconductor layer is provided on said second insulator layer, wherein said control electrode is provided between said first insulator layer and said second insulator layer.

12. A device as claimed in claim 1 in which said insulator layer has a thickness of more than that of said gate insulator film.

* * * * *